(12) United States Patent
Furutani

(10) Patent No.: US 8,659,861 B2
(45) Date of Patent: Feb. 25, 2014

(54) ELECTRONIC COMPONENT DEVICE AND PACKAGE SUBSTRATE

(75) Inventor: Koji Furutani, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 13/446,001

(22) Filed: Apr. 13, 2012

(65) Prior Publication Data

US 2012/0200965 A1 Aug. 9, 2012

Related U.S. Application Data

(63) Continuation of application No. PCT/JP2010/068613, filed on Oct. 21, 2010.

(30) Foreign Application Priority Data

Nov. 2, 2009 (JP) ................................. 2009-251765

(51) Int. Cl.
*H02H 9/02* (2006.01)

(52) U.S. Cl.
USPC .......................................................... 361/56

(58) Field of Classification Search
USPC ......................................................... 361/56
See application file for complete search history.

(56) References Cited

U.S. PATENT DOCUMENTS

| | | | |
|---|---|---|---|
| 6,198,136 B1 | 3/2001 | Voldman et al. | |
| 6,838,775 B2 | 1/2005 | Takahashi | |
| 2004/0119159 A1 | 6/2004 | Takahashi | |
| 2009/0067113 A1 | 3/2009 | Urakawa | |

FOREIGN PATENT DOCUMENTS

| | | | |
|---|---|---|---|
| EP | 2 061 123 A1 | | 5/2009 |
| EP | 2 280 458 A1 | | 2/2011 |
| JP | 10-041458 A | | 2/1998 |
| JP | 2003-123936 | * | 4/2003 |
| JP | 2004-146524 A | | 5/2004 |
| JP | 2006-294724 | * | 10/2006 |
| JP | 2007-265713 | * | 10/2007 |
| WO | 2008/146514 A1 | | 12/2008 |
| WO | 2009/136535 A1 | | 11/2009 |

OTHER PUBLICATIONS

Official Communication issued in International Patent Application No. PCT/JP2010/068613, mailed on Jan. 11, 2011.

* cited by examiner

*Primary Examiner* — Ronald W Leja
(74) *Attorney, Agent, or Firm* — Keating & Bennett, LLP

(57) ABSTRACT

In an electronic component device, an ESD protection element including a cavity portion and a pair of opposed discharge electrodes is disposed inside a package substrate. A composite portion made of a composite material including a metal material and an insulating material is disposed on a bottom of the cavity portion. The package substrate including the ESD protection element disposed therein reduces the size of the electronic component device and reliably prevents damage to and malfunctioning of the electronic component device.

6 Claims, 3 Drawing Sheets

ELECTRONIC COMPONENT DEVICE AND PACKAGE SUBSTRATE

BACKGROUND OF THE INVENTION

1. Field of the Invention

The present invention relates to an electronic component device and, more specifically, to an electronic component device in which an electronic component element is mounted on a package substrate that includes an ESD protection element therein. The present invention also relates to a package substrate that includes an ESD protection element therein.

2. Description of the Related Art

For an electronic component device having a precision structure and functioning with high precision, such as an IC device or a SAW device, an important issue is taking measures against electro-static discharge (ESD) and preventing damage to and malfunctioning of the electronic component device if a charged object comes into contact with or is close to the electronic component device.

Traditionally, for example, in an IC device, an IC element itself may include the ESD protection function. However, a problem arises in that it is difficult to further incorporate the ESD protection function into an IC element having high-density functions and also a problem arises in that, even when such incorporation is achieved, it is impossible to provide a sufficiently robust ESD protection function.

In an IC device disclosed in Japanese Unexamined Patent Application Publication No. 10-41458, as illustrated in FIG. 6, an ESD protection component 103 arranged separately from an IC element 102 is mounted on a substrate 101. Specifically, a branch line 104b is branched from a signal line 104a inside the substrate 101, another end of the branch line 104b is extended to the surface of the substrate 101, and that end is connected to the ESD protection component 103.

In this IC device, for example, if an excessive voltage caused by static electricity is applied to a terminal 105, the static electricity is discharged in the ESD protection component 103 and guided to the ground side, and thus, the IC element 102 is not damaged and no malfunction occurs.

However, the method described in Japanese Unexamined Patent Application Publication No. 10-41458 requires that, in addition to the IC element 102, the ESD protection component 103 be mounted on the surface of the substrate 101, and thus, the substrate 101 must have a relatively large surface area. This raises a problem in that the size of the IC device is increased. In addition, a problem arises in that the cost is increased because the ESD protection component 103, which is a separate component, is used.

SUMMARY OF THE INVENTION

To overcome the problems described above, preferred embodiments of the present invention provide, in an electronic component device, a package substrate on which an electronic component element is mounted and that includes an ESD protection element therein. Preferably, the ESD protection element includes at least a cavity portion disposed inside the package substrate and a pair of opposed discharge electrodes disposed inside the cavity portion, and the ESD protection element is located between a signal line disposed inside the package substrate and a ground electrode disposed on a surface of the package substrate.

The ESD protection element may preferably further include a composite portion disposed on a bottom of the cavity portion, the composite portion being made of a composite material including a metal material and an insulating material, the insulating material defining the package substrate, and the pair of discharge electrodes may be disposed on the composite portion. With this configuration, the thermal coefficient of expansion of the composite portion is between that of the discharged electrodes and that of the package substrate, and the difference between the thermal coefficient of expansion of the discharged electrodes and that of the package substrate can be reduced by the composite portion. Thus, separation of the discharged electrodes from the package substrate and changes in characteristics over time are prevented or minimized. In addition, adjustment of the type and quantity of the metal material included in the composite portion enables adjustment of the discharge inception voltage.

The ground electrode for the ESD protection element disposed on the surface of the package substrate may preferably be configured as a ground electrode dedicated to the ESD protection element, the ground electrode being separate from a ground electrode of the electronic component element. With this configuration, because static electricity discharged in the ESD protection element and guided to the ground side can be prevented from being delivered to the electronic component element, the advantageous effects of protecting the electronic component element against ESD are improved.

In the electronic component device of various preferred embodiments of the present invention, the ESD protection element is included inside the package substrate on which the electronic component element is mounted. Thus, unlike traditional electronic component devices, it is not necessary to mount an ESD protection component on the surface of the substrate in addition to the electronic component element, and this eliminates the need to use a substrate having a large surface area. This enables miniaturization of the electronic component device.

In addition, because an additional ESD protection component is not included or required, the cost of the electronic component device is reduced.

Moreover, because the ESD protection function is not incorporated in an electronic component element itself, such as an IC element, a sufficiently robust ESD protection function is achieved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments are described below with reference to the drawings.

First Preferred Embodiment

Figure 1:
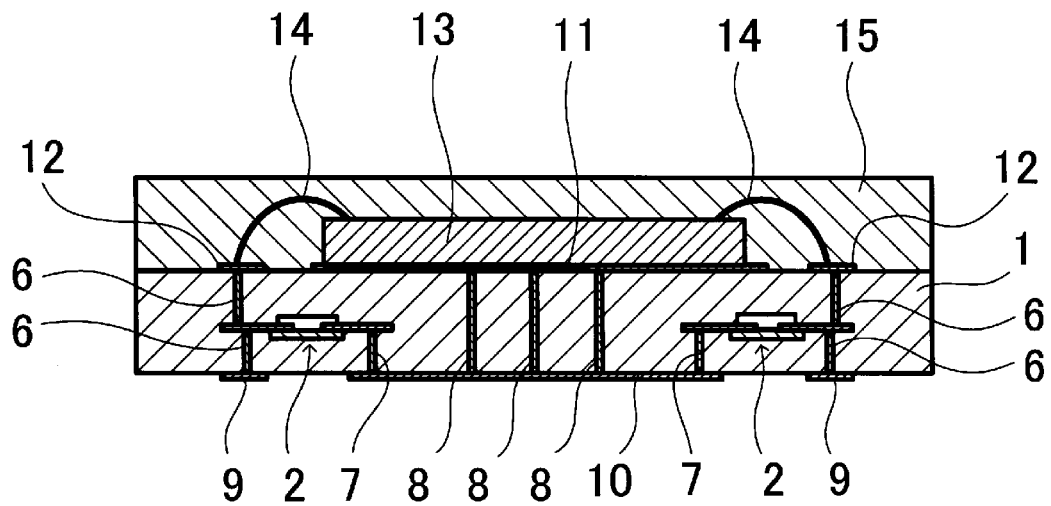
FIG. 1 is a cross-sectional view that illustrates an electronic component device according to a first preferred embodiment of the present invention.
Figure 2:
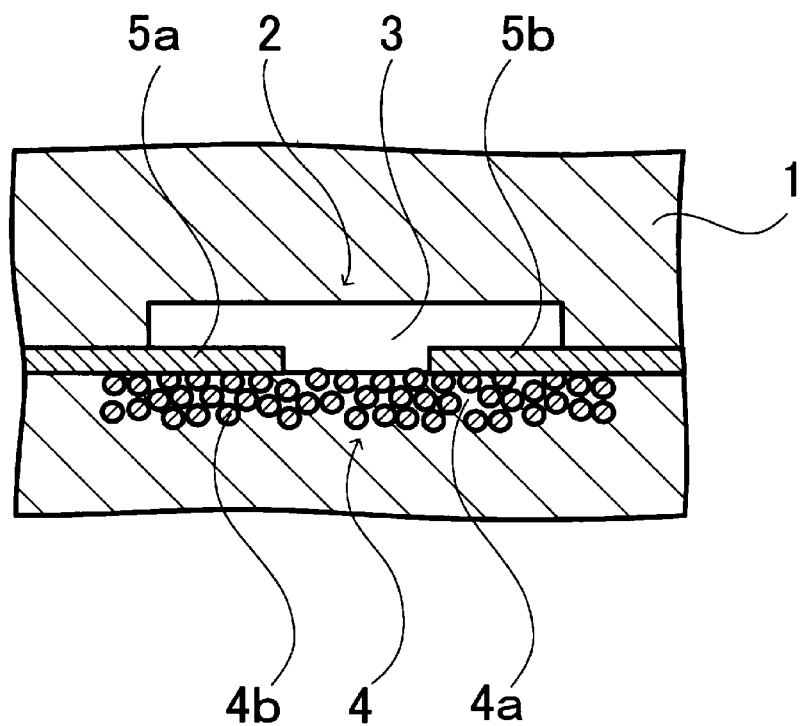
FIG. 2 is a main-portion cross-sectional view that illustrates a main portion of the electronic component device according to the first preferred embodiment of the present invention.

FIGS. 1 and 2 illustrate an electronic component device according to a first preferred embodiment of the present invention. FIG. 1 is a cross-sectional view of the electronic component device, and FIG. 2 is a main-portion cross-sectional view that illustrates an ESD protection element portion of the electronic component device.

In FIGS. 1 and 2, reference numeral 1 represents a package substrate, and an ESD protection element 2 is disposed therein. The package substrate 1 is insulative, and a ceramic, for example, is preferably used in the package substrate 1 in the first preferred embodiment. Any suitable material other than a ceramic may be used in the package substrate 1, such as a resin, for example.

As illustrated in FIG. 2, the ESD protection element 2 preferably includes a cavity portion 3 that is disposed inside the package substrate 1, a composite portion 4 made of a composite material preferably including an insulating material 4a (for example, ceramic in the present preferred embodiment) defining the package substrate 1 and a metal material 4b, for example, and a pair of opposed discharge electrodes 5a and 5b disposed on the composite portion 4. Any suitable kind of the material may be used as the metal material 4b. In the present preferred embodiment, copper, for example, is preferably used. Any material may be used for the discharge electrodes 5a and 5b. In the present preferred embodiment, copper, for example, is preferably used, as in the case of the metal material 4b.

Because the composite portion 4 is preferably made of the material including the insulating material 4a and the metal material 4b, the composite portion 4 has a thermal coefficient of expansion between that of the discharge electrodes 5a and 5b and that of the package substrate 1, and thus, performs the function of reducing the difference between the thermal coefficient of expansion of the discharge electrodes 5a and 5b and that of the package substrate 1. As a result, if heat is applied during the formation of the package substrate 1 by firing, during mounting of a completed electronic component device on a printed circuit board of an electronic apparatus by reflow soldering, or during use of an electronic apparatus, the composite portion 4 reduces the occurrence of separation of the discharge electrodes 5a and 5b from the package substrate 1. Accordingly, changes in characteristics, including a discharge inception voltage, over time are effectively prevented or minimized.

Adjusting the kind and quantity of the metal material 4b included in the composite portion 4 enables adjustment of the discharge inception voltage. Specifically, the discharge inception voltage decreases with an increase in the conductivity of the metal material and with an increase in the quantity of the metal material.

The cavity portion 3 of the ESD protection element 2 may preferably be filled with a rare gas, such as argon or neon, for example. If such a rare gas is provided therein, the discharge inception voltage can be reduced. In the present preferred embodiment, the cavity portion 3 preferably is not filled with a rare gas.

In the electronic component device according to the present preferred embodiment, a signal line 6, an ESD protection element ground line 7, and an electronic component element ground line 8 are preferably disposed inside the package substrate 1, and an input/output electrode 9 and a common ground electrode 10 common to the electronic component element and the ESD protection element 2 are preferably disposed on the lower surface of the package substrate 1. The ESD protection element 2 is located between the signal line 6 and the common ground electrode 10. Any suitable number of ESD protection elements 2 may be used depending on the necessity.

Preferably, a ground pad 11 and a wiring pad 12 are disposed on the upper surface of the package substrate 1, an IC element 13 defining the electronic component element is mounted on the ground pad 11, and the wiring pad 12 and the IC element 13 are connected by a wire bond 14 disposed therebetween. The upper surface of the package substrate 1 is preferably sealed with a sealing resin 15.

If a charged object comes into contact with or comes close to the electronic component device having the above-described structure according to the present preferred embodiment and an excessive voltage caused by static electricity is applied to the signal line 6, the static electricity is discharged in the ESD protection element 2 and transferred to the common ground electrode 10, and the IC element 13 is not damaged and no malfunction occurs in the IC element 13. Typically, the ESD protection element 2 is in an electrically open state and does not allow electricity to flow therethrough.

Next, a non-limiting example of a method of producing an electronic device according to the present preferred embodiment is described. One of the unique features of preferred embodiments of the present invention is that the package substrate 1 includes the ESD protection element 2, so a method of producing the package substrate 1 will be described below.

The package substrate 1 is produced by stacking and firing of a plurality of ceramic green sheets.

First, insulating ceramic powder of a predetermined composition is mixed with a solvent, a binder, and/or other material to form a slurry, the slurry is shaped into thin films using a doctor blade, and ceramic green sheets are formed.

Copper powder having a predetermined particle diameter is mixed with a solvent, a binder, and/or other material and an electrode paste is formed.

The ceramic powder used in the ceramic green sheets and the copper powder used in the electrode paste are mixed together with a predetermined mixture ratio, the mixture is further mixed with a solvent, a binder, and/or other material, and a composite paste is formed.

Next, holes for forming via holes that are to become the signal line 6, the ESD protection element ground line 7, and the electronic component element ground line 8 are formed in the ceramic green sheets. The locations and the number of the holes vary among the ceramic green sheets. The holes in the ceramic green sheets are filled with the electrode paste.

Next, the composite paste for forming the composite portion 4 is applied on the ceramic green sheet on which the ESD protection element 2 is to be formed so as to have a predetermined shape, the electrode paste for forming the discharge electrodes 5a and 5b is applied thereon so as to have a predetermined shape, and a resin paste for forming the cavity portion 3, the resin paste being formulated to disappear when fired, is applied on the composite paste and the electrode paste.

Then, a predetermined number of the ceramic green sheets, including the ceramic green sheet on which the ESD protection element 2 is to be formed and the other ceramic green sheets, are stacked in a predetermined order, the stacked ceramic green sheets are pressed and bonded, and an unfired ceramic laminate is formed.

Then, a conductive paste for forming the input/output electrode 9, the common ground electrode 10, the ground pad 11, and the wiring pad 12 is applied on the upper surface and the lower surface of the ceramic laminate so as to have a predetermined shape. The conductive paste may not be applied at this stage, but alternatively, may be applied in advance to a ceramic green sheet that will be in the uppermost or lowermost position in the ceramic laminate.

Then, the ceramic laminate is fired with a predetermined profile, and the package substrate 1 is produced. The ESD protection element 2 including the cavity portion 3, the composite portion 4, and the discharge electrodes 5a and 5b is disposed inside the package substrate 1. In the foregoing description, a case of producing a single package substrate 1 is described. Alternatively, a plurality of package substrates may be produced at a time from a large ceramic laminate. In this case, before or after firing, the large ceramic laminate is cut into pieces having the size of each package substrate.

Figure 3:
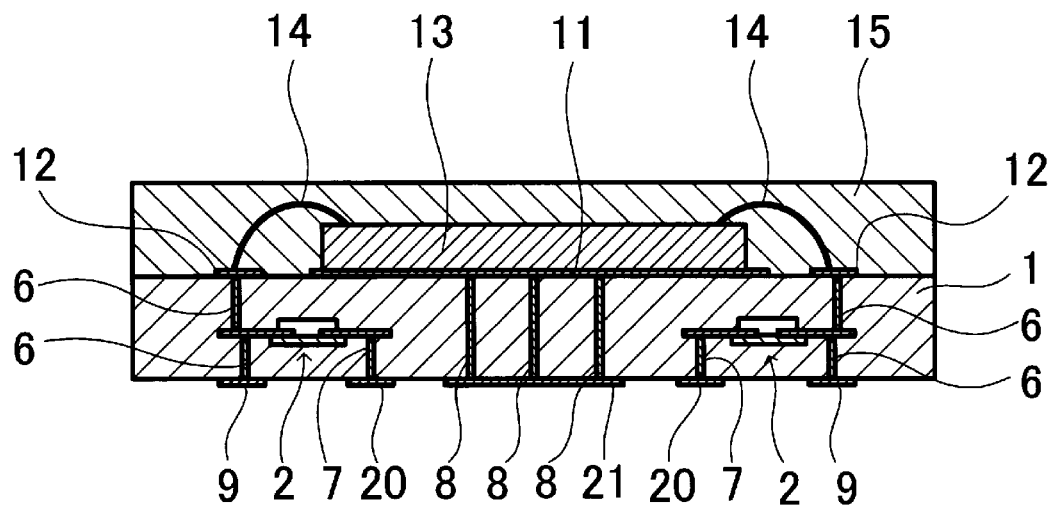
FIG. 3 is a cross-sectional view that illustrates an electronic component device according to a second preferred embodiment of the present invention.

Finally, the IC element 13 is mounted on the package substrate 1 by a widely used method, the wire bond 14 is applied, and the sealing resin 15 is formed on the upper surface of the package substrate 1, on which the IC element 13 is mounted. In this manner, the electronic component device according to the present preferred embodiment is completed.
Second Preferred Embodiment FIG. 3 illustrates an electronic component device according to a second preferred embodiment of the present invention. FIG. 3 is a cross-sectional view of the electronic component device.

In the electronic component device according to the second preferred embodiment, the common ground electrode 10 (see FIG. 1) disposed on the lower surface of the package substrate 1 is preferably replaced with individual ground electrodes, i.e., a ground electrode 20 dedicated to the ESD protection element and a ground electrode 21 dedicated to the electronic component element. The remaining configuration is the same or substantially the same as that in the first preferred embodiment.

Figure 4:
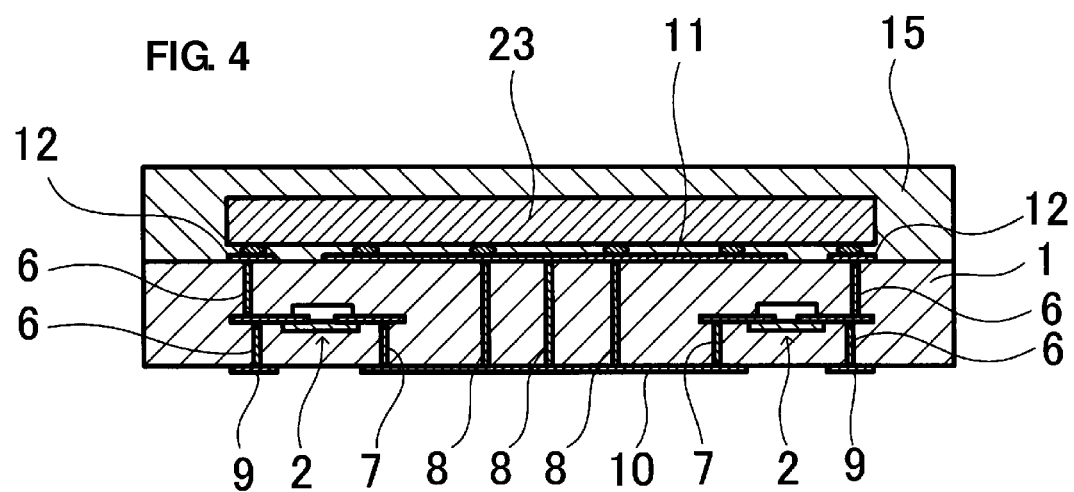
FIG. 4 is a cross-sectional view that illustrates an electronic component device according to a third preferred embodiment of the present invention.

The electronic component device according to the second preferred embodiment prevents static electricity discharged in the ESD protection element 2 and guided to the ground side from being delivered to the electronic component element (IC element 13). Thus, the advantageous effects of protecting the electronic component element against ESD are improved.
Third Preferred Embodiment FIG. 4 illustrates an electronic component device according to a third preferred embodiment of the present invention. FIG. 4 is a cross-sectional view of the electronic component device.

Figure 5:
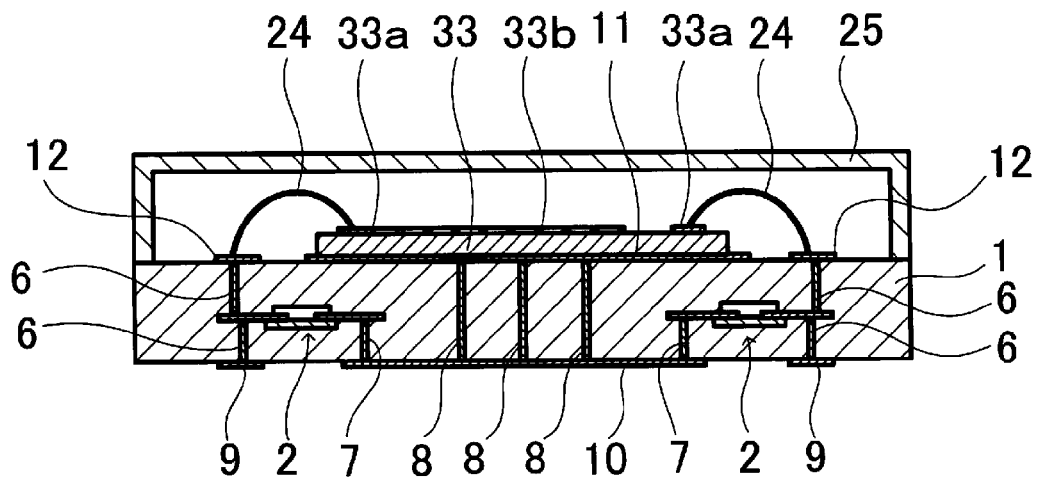
FIG. 5 is a cross-sectional view that illustrates an electronic component device according to a fourth preferred embodiment of the present invention.
Figure 6:
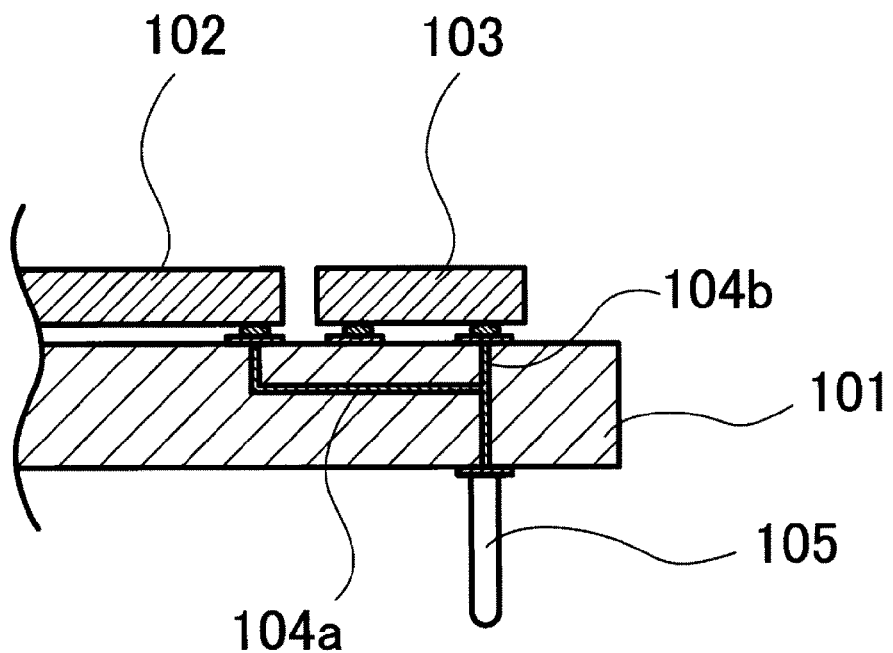
FIG. 6 is a main-portion cross-sectional view that illustrates a main portion of a traditional electronic component device.

In the electronic device according to the third preferred embodiment, an IC element 23 as the electronic component element is preferably flip-chip mounted on the ground pad 11 and the wiring pad 12 of the package substrate 1 using solder bumps. The remaining configuration is the same or substantially the same as that in the first preferred embodiment.
Fourth Preferred Embodiment FIG. 5 illustrates an electronic component device according to a fourth preferred embodiment of the present invention. FIG. 5 is a cross-sectional view of the electronic component device.

In the electronic device according to the fourth preferred embodiment, a SAW element 33 as the electronic component element is preferably mounted on the package substrate 1, and the wiring pad 12 of the package substrate 1 and a pad electrode 33a of the SAW element 33 are preferably connected with a wire bond 24 disposed therebetween. In FIG. 5, reference numeral 33b represents an IDT electrode disposed on the surface of the SAW element 33.

In the electronic device according to the fourth preferred embodiment, the upper surface of the package substrate 1, on which the SAW element 33 is mounted, is preferably sealed not with a sealing resin but with a top cover 25.

According to preferred embodiments of the present invention, even in a SAW device, in which ESD is a problem, as in the case of an IC device, the electronic component element is protected against ESD.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An electronic component device comprising:
a package substrate including an upper electrode arranged on an upper surface of the package substrate and a lower electrode arranged on a lower surface of the package substrate; and
an electronic component element mounted on the package substrate; wherein
the package substrate includes an electro-static discharge protection element disposed therein;
the electro-static discharge protection element includes a cavity portion disposed inside the package substrate and a pair of opposed discharge electrodes disposed inside the cavity portion;
the electro-static discharge protection element is located between a signal line disposed inside the package substrate and an electro-static discharge ground electrode disposed on a surface of the package substrate;
the signal line includes an upper portion and a lower portion, the upper portion directly contacting one of the pair of opposed discharge electrodes and the upper electrode, and the lower portion directly contacting the one of the pair of opposed discharge electrodes and the lower electrode;
the electro-static discharge ground electrode is separate and distinct from a ground electrode dedicated to the electronic component element;
the electro-static discharge ground electrode is dedicated to the electro-static discharge protection element; and
the electro-static discharge ground electrode is directly connected to the other one of the pair of opposed discharge electrodes by only a via hole filled with electrode paste.

2. The electronic component device according to claim 1, wherein the electro-static discharge protection element further includes a composite portion on a bottom of the cavity portion, the composite portion being made of a composite material including a metal material and an insulating material, the insulating material defining the package substrate, and the pair of discharge electrodes is disposed on the composite portion.

3. The electronic component device according to claim 1, wherein the electronic component element is one of an IC element and a SAW element.

4. The electronic component device according to claim 1, wherein the electronic component element is mounted to the upper surface of the package substrate, the upper surface being sealed with at least one of a sealing resin and a top cover.

5. A package substrate arranged to have an electronic component element mounted thereon, the package substrate comprising:
   an upper electrode arranged on an upper surface of the package substrate and a lower electrode arranged on a lower surface of the package substrate; and
   an electro-static discharge protection element disposed in the package substrate; wherein
   the electro-static discharge protection element includes at least a cavity portion disposed inside the package substrate and a pair of opposed discharge electrodes disposed inside the cavity portion;
   the electro-static discharge protection element is located between a signal line disposed inside the package substrate and an electro-static discharge ground electrode disposed on a surface of the package substrate;
   the signal line includes an upper portion and a lower portion, the upper portion directly contacting one of the pair of opposed discharge electrodes and the upper electrode, and the lower portion directly contacting the one of the pair of opposed discharge electrodes and the lower electrode;
   the electro-static discharge ground electrode is separate and distinct from a ground electrode dedicated to the electronic component element to be mounted on the package substrate;
   the electro-static discharge ground electrode is dedicated to the electro-static discharge protection element; and
   the electro-static discharge ground electrode is directly connected to the other one of the pair of opposed discharge electrodes by only a via hole filled with electrode paste.

6. The package substrate according to claim 5, wherein the electro-static discharge protection element further includes a composite portion on a bottom of the cavity portion, the composite portion is made of a composite material including a metal material and an insulating material, the insulating material defining the package substrate, and the pair of discharge electrodes is disposed on the composite portion.

* * * * *